(12) United States Patent
Tanizawa et al.

(10) Patent No.: US 7,411,382 B2
(45) Date of Patent: Aug. 12, 2008

(54) CURRENT DETECTION APPARATUS

(75) Inventors: Yukihiko Tanizawa, Kariya (JP);
Seiichirou Ootake, Hazu-gun (JP);
Takashige Saitou, Ama-gun (JP);
Masahiro Aratani, Okazaki (JP);
Takeshi Tukamoto, Okazaki (JP);
Masato Ishihara, Anjo (JP); Norio Miyahara, Obu (JP)

(73) Assignees: DENSO CORPORATION, Kariya (JP);
Jeco Co., Ltd., Saitama-pref. (JP)

( * ) Notice: Subject to any disclaimer, the term of this patent is extended or adjusted under 35 U.S.C. 154(b) by 0 days.

(21) Appl. No.: 11/398,639

(22) Filed: Apr. 6, 2006

(65) Prior Publication Data

US 2006/0232262 A1    Oct. 19, 2006

(30) Foreign Application Priority Data

Apr. 14, 2005 (JP) .............................. 2005-117566

(51) Int. Cl.
*G01R 15/20* (2006.01)
(52) U.S. Cl. ................................. 324/117 H
(58) Field of Classification Search .................... None
See application file for complete search history.

(56) References Cited

U.S. PATENT DOCUMENTS

| | | | | |
|---|---|---|---|---|
| 3,121,788 A * | 2/1964 | Hilbinger | ............... | 708/841 |
| 3,257,628 A * | 6/1966 | Kaenel | ............... | 324/251 |
| 3,456,900 A * | 7/1969 | Fischell et al. | ............... | 324/244 |
| 4,972,140 A * | 11/1990 | Okazaki et al. | ............... | 324/117 H |
| 5,493,218 A * | 2/1996 | Hayashi et al. | ............... | 324/207.21 |
| 5,952,819 A * | 9/1999 | Berkcan et al. | ............... | 324/117 R |
| 6,411,078 B1 * | 6/2002 | Nakagawa et al. | ............... | 324/117 H |
| 6,876,189 B2 * | 4/2005 | Takatsuka et al. | ............... | 324/117 H |
| 6,937,008 B2 * | 8/2005 | Matsuzaki et al. | ............... | 324/207.2 |
| 2004/0095126 A1 | 5/2004 | Kudo et al. | | |

FOREIGN PATENT DOCUMENTS

| | | |
|---|---|---|
| JP | A-7-218552 | 8/1995 |
| JP | A-2000-275279 | 10/2000 |
| JP | A-2002-296305 | 10/2002 |
| JP | A-2004-31170 | 1/2004 |

* cited by examiner

*Primary Examiner*—Jermele M Hollington
(74) *Attorney, Agent, or Firm*—Posz Law Group, PLC

(57) ABSTRACT

A current detection apparatus includes a magnetic core having a ring shape with a gap and a center opening portion through which a current path is disposed, and a magnetic sensor including a magnetic sensing element such as a Hall effect element arranged in the gap. When a current flows through the current path, the magnetic core generates magnetic flux therein so that magnetic field is generated in the gap. The magnetic sensor outputs different electrical signals, each of which is measured in a different measurement range and corresponds to intensity of the magnetic field in the gap. The current detection apparatus measures the current based on the electrical signals outputted from the magnetic sensor.

19 Claims, 8 Drawing Sheets

CURRENT DETECTION APPARATUS

CROSS REFERENCE TO RELATED APPLICATION

This application is based on and incorporates herein by reference Japanese Patent Application No. 2005-117566 filed on Apr. 14, 2005.

FIELD OF THE INVENTION

The present invention relates to a current detection apparatus for detecting current with a magnetic sensor.

BACKGROUND OF THE INVENTION

FIG. 7 is a perspective view showing a current detection apparatus 90 disclosed in JP-A-2002-296305 and used to measure current of an in-vehicle battery.

The current detection apparatus 90 includes a ring-shaped magnetic core 20 having a center opening and a gap 20g and a magnetic sensor 30 arranged in the gap 20g.

As indicated by a dashed line in FIG. 7, a busbar 10 is inserted through the center opening of the magnetic core 20 and surrounded by the magnetic core 20. When current to be measured flows through the busbar 10, magnetic flux is generated in the magnetic core 20. Thus, the magnetic core 20 acts as a magnetic flux path.

As shown in FIG. 8A, the magnetic sensor 30 has a power terminal 30v, a ground terminal 30g, and an output terminal 30s. The magnetic sensor 30 covers a predetermined measurement range and outputs an electrical signal having a value corresponding to intensity of magnetic field in the gap 20g. The current detection apparatus 90 measures the current based on the electrical signal output from the magnetic sensor 30. As shown in FIGS. 8B and 8C, the magnetic sensor 30 is constructed as a Hall effect integrated circuit (IC) such that a Hall effect element 30h and a peripheral circuit are packaged in a single IC. For example, the peripheral circuit includes a temperature detection element (TMP) such as a resistor, an analog multiplexer (MUX), an amplifier (AMP), a A/D converter (ADC), a digital signal processor (DSP), a D/A converter (DAC), a read only memory (ROM), and an a voltage follower circuit (VFC) as an output circuit. Thus, an output of the Hall effect element 30h is amplified and corrected for temperature dependence by the peripheral circuit and then output from the magnetic sensor 30.

For example, as disclosed in JP-A-2004-31170, there is a proposal that such a current detection apparatus of FIG. 7 should be used for battery charge control that prevent the battery from being charged under acceleration to improve fuel efficiency, or used for battery condition monitor that monitors condition of a battery by calculating an internal resistance of the battery.

In the battery charge control, battery current is controlled in a range between plus (charge) and minus (discharge) tens of amperes (A). A center point of the range is a zero-point (0 A) where no battery current flows. If a point where the battery current flows is used as the zero-point for a long time, the battery may be overcharged or overdischarged. In the battery charge control, therefore, the battery current needs to be measured very accurately.

In the battery condition monitor, the internal resistance of the battery is calculated as a slope of volt-ampere characteristics of the battery. Therefore, as the internal resistance is calculated from current values ranging widely, accuracy of the calculated internal resistance may be improved. Because discharging current flowing when an engine starts reaches a few hundreds of amperes, an accurate value of the internal resistance can be obtained by calculating the internal resistance from the discharging current and a battery voltage corresponding to the discharging current.

As described below, however, one current detection apparatus 90 alone cannot achieve both the battery charge control and the battery condition monitor.

For example, the current detection apparatus 90 outputs an analog voltage ranging from 0 V to 5V. The analog voltage is converted to digital signal used for various control purposes. If the analog voltage ranging from 0 V to 5 V is converted into 10-bit digital signal, one least significant bit (1LSB) of the digital signal has a weight of approximately 4.9 mV.

If the current detection apparatus 90 is used only for the battery charge control, the current detection apparatus 90 needs a current measurement range from −100 A to +100 A, for example. The current measurement range from −100 A to +100 A is converted into a voltage output range from 0.5 V to 4.5 V as follows:

$$\frac{\text{VOLTAGE}}{\text{CURRENT}} = \frac{4.5V - 0.5V}{100A - (-100A)} = \frac{4V}{200A} = 20\,\text{mV}/A$$

In this case, current of 1 A corresponds to voltage of 20 mV and the current detection apparatus 90 has a resolution of 0.25 A. Because the current detection apparatus 90 needs a resolution of approximately 1 A to perform the battery charge control, the battery charge control can be achieved by using the current detection apparatus 90 having the current measurement range from −100 A to +100 A.

In contrast, if the current detection apparatus 90 is used for both the battery charge control and the battery condition monitor, the current detection apparatus 90 needs a current measurement range of −1000 A to +100 A. The current measurement range from −1000 A to +100 A is converted into the voltage output range from 0.5 V to 4.5 V as follows:

$$\frac{\text{VOLTAGE}}{\text{CURRENT}} = \frac{4.5V - 0.5V}{100A - (-1000A)} = \frac{4V}{1100A} = 3.6\,\text{mV}/A$$

In this case, the current of 1 A corresponds to voltage of 3.6 mV and the current detection apparatus 90 has a resolution of approximately 1.39 A. Therefore, as a result of reduction in resolution, the battery charge control cannot be achieved by using the current detection apparatus 90 having the current measurement range from −1000 A to +100 A.

As described above, one current detection apparatus 90 alone cannot meet opposite requirements of the battery charge control and the battery condition monitor. The opposite requirements can be met by using two current detection apparatus 90, i.e., one current detection apparatus 90 having a very accurate measurement range suitable for the battery charge control and the other current detection apparatus 90 having a wide measurement range suitable for the battery condition monitor.

However, use of the two current detection apparatus 90 doubles manufacturing cost and process and increases overall size and installation space.

SUMMARY OF THE INVENTION

In view of the above-described problem, it is an object of the present invention to provide a current detection apparatus capable of being used for various control purposes related to a detected current without increasing size and cost.

A current detection apparatus includes a magnetic core having a ring shape with a gap and a center opening portion through which a current path is disposed, and a magnetic sensor including a magnetic sensing element such as a Hall effect element arranged in the gap. When a current flows through the current path, the magnetic core generates magnetic flux therein so that magnetic field is generated in the gap. The magnetic sensor includes a plurality of amplifiers, each of which has a different gain and corresponds to intensity of the magnetic field in the gap. The current detection apparatus measures the current based on the electrical signals outputted from the magnetic sensor.

In the current detection apparatus, the magnetic sensor outputs the different electrical signals corresponding to the current measured in accordance with the respective measurement ranges. Therefore, the current detection apparatus can be used for various control purposes related to the measured current. Because the current detection apparatus alone have multiple measurement ranges, manufacturing cost and process can be reduced as compared to a case where multiple apparatus having one measurement range are used. Accordingly, overall size can be reduced and installation space can be easily provided.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

A current detection apparatus 100 of the first embodiment will now be described with reference to FIGS. 1A to 4B. The current detection apparatus 100 may be, for example, used to measure current of a vehicular battery.

Figure 2A:
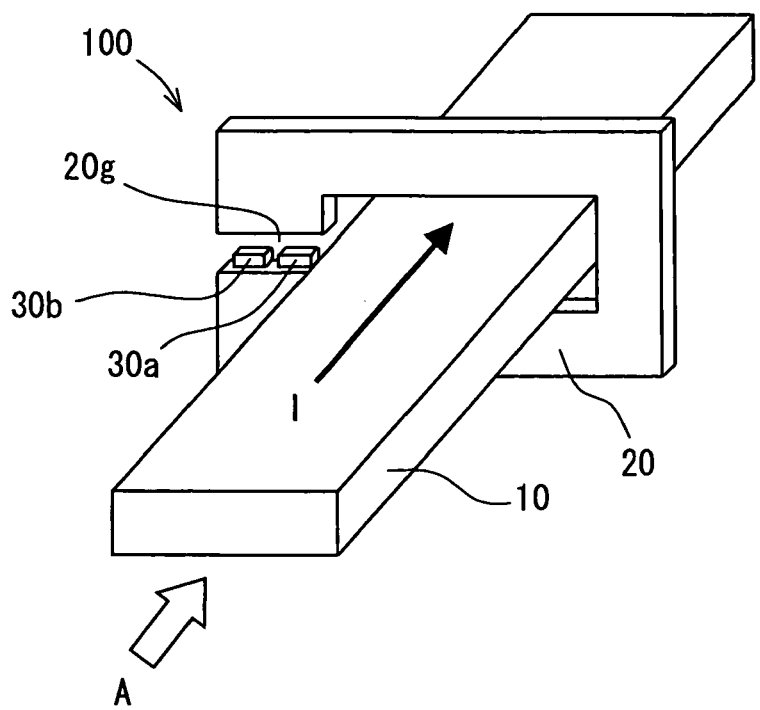
FIG. 2A is a perspective view showing a portion of the current detection apparatus of FIGS. 1A and 1B.
Figure 2B:
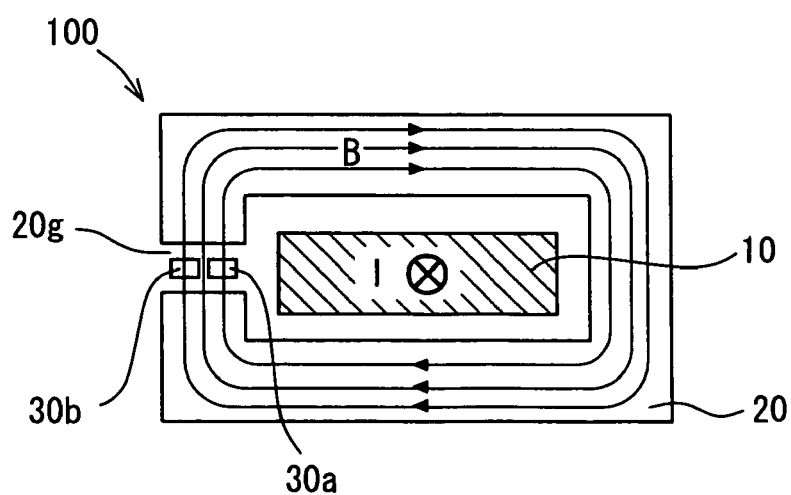
FIG. 2B is a view illustrating a direction of flow of current and magnetic flux generated by the current.

The current detection apparatus 100 includes a ring-shaped magnetic core 20 having a gap 20g and two magnetic sensors 30a, 30b arranged in the gap 20g. As indicated by a dashed line in FIG. 2A, a busbar 10 is inserted through a center opening of the magnetic core 20 and surrounded by the magnetic core 20. FIG. 2B is a view seen from an arrow A of FIG. 2A. As shown in FIG. 2B, when current I to be measured flows through the busbar 10, magnetic flux B generated by the current I passes through the magnetic core 20. Thus, the magnetic core 20 acts as a magnetic flux path.

The magnetic core 20 is made of a magnetic material. The magnetic sensors 30a, 30b have different measurement ranges. The magnetic sensors 30a, 30b cover the respective measurement ranges and output electrical signals corresponding to intensity of magnetic field existing in the gap 20g. Thus, the current detection apparatus 100 can measures the current I in the two different measurement ranges by using the signals output from the magnetic sensors 30a, 30b.

Figure 8A:
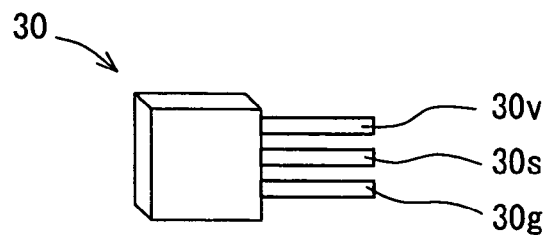
FIG. 8A is a view showing a magnetic sensor of FIG. 7, and FIGS. 8B and 8C are circuit diagrams of the magnetic sensor of FIG. 8A.
Figure 8B:
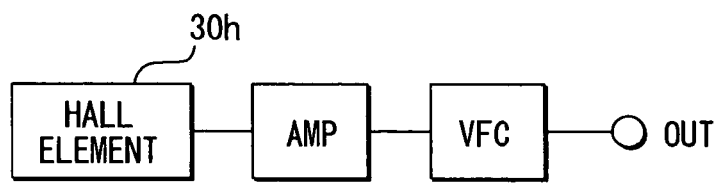
Figure 8C:
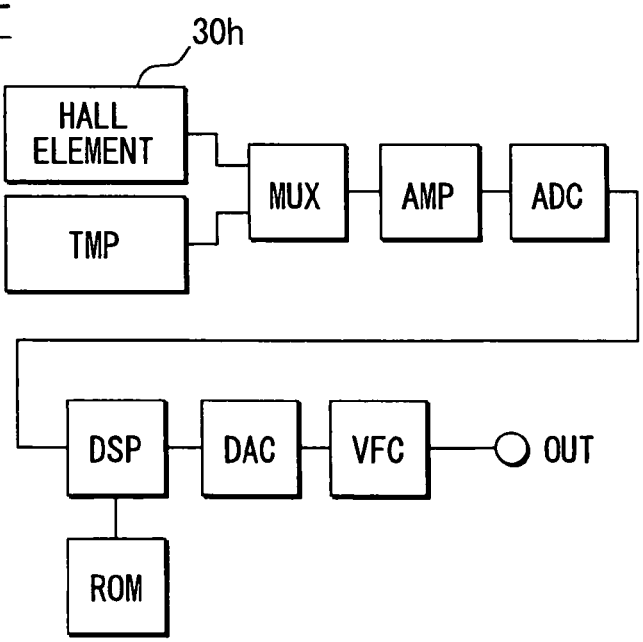

The magnetic sensors 30a, 30b are similar to the magnetic sensor 30 of FIGS. 8A to 8C. Specifically, each of the magnetic sensors 30a, 30b has a power terminal 30v, a ground terminal 30g, and an output terminal 30s. Each of the magnetic sensors 30a, 30b is constructed as a Hall effect integrated circuit (IC) such that a Hall effect element 30h and a peripheral circuit are packaged in a single IC. The Hall effect element 30h detects the magnetic field by using Hall effect. In the magnetic sensors 30a, 30b, the output of the Hall effect element 30h is output to an external circuit after being amplified and corrected for temperature dependence. In this correction for the temperature dependence, sensitivity and offset are corrected (i.e., adjusted).

Figure 3A:
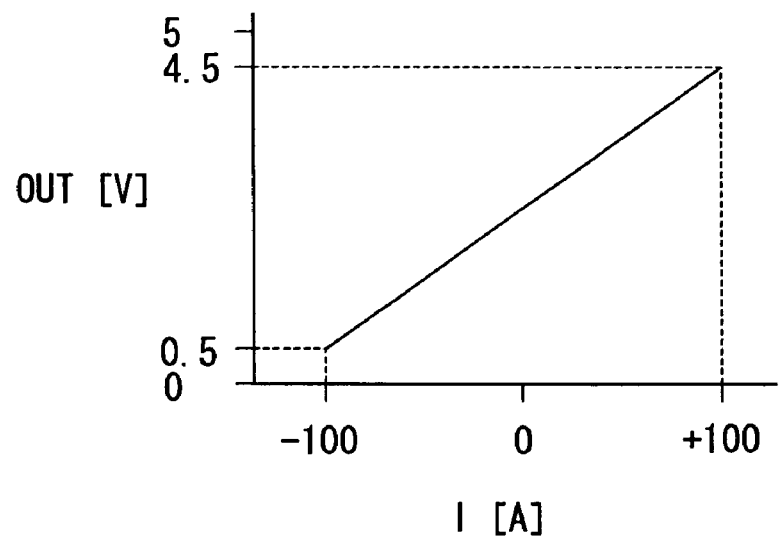
FIGS. 3A and 3B are diagrams illustrating a relation between a measurement range and an output voltage of magnetic sensors of FIGS. 1A and 1B.

As shown in FIG. 3A, the magnetic sensor 30a has an accurate measurement range from −100 A to +100 A so that the magnetic sensor 30a can very accurately measure charging and discharging currents flowing when a vehicle runs. A center point of the accurate measurement range is a zero-point, which represents 0 A. Therefore, the battery charge control can be achieved by using an output signal of the magnetic sensor 30a.

Figure 3B:
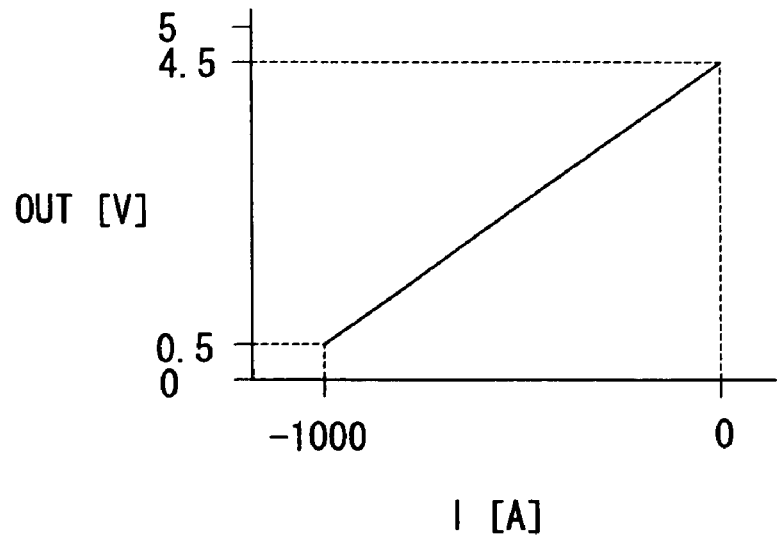

As shown in FIG. 3B, the magnetic sensor 30b has a wide measurement range from −1000 A to 0 A so that the magnetic sensor 30b can measure a discharging current of a few hundred amperes flowing when an engine starts. Therefore, the internal resistance of the battery can be very accurately calculated from an output signal of the magnetic sensor 30b so that the battery condition detection can be achieved by using the output signal of the magnetic sensor 30b.

The output signals of the magnetic sensors 30a, 30b are converted from analog signal to digital signal by an A/D converter. By selectively switching between channels of the A/D converter, it is possible to change a weight of 1 LSB of the digital signal output from the A/D converter.

The current detection apparatus 100 includes both the magnetic sensor 30a having the accurate measurement range of FIG. 3A and the magnetic sensor 30b having the wide measurement range of FIG. 3B. In other words, the magnetic sensor 30a has high sensitivity to with reference of change of the current I and the magnetic sensor has low sensibility with reference to change of the current I. Therefore, the current detection apparatus 100 can meet the opposite requirements of the battery charge control and the internal resistance calculation for the battery condition detection.

Figure 1A:
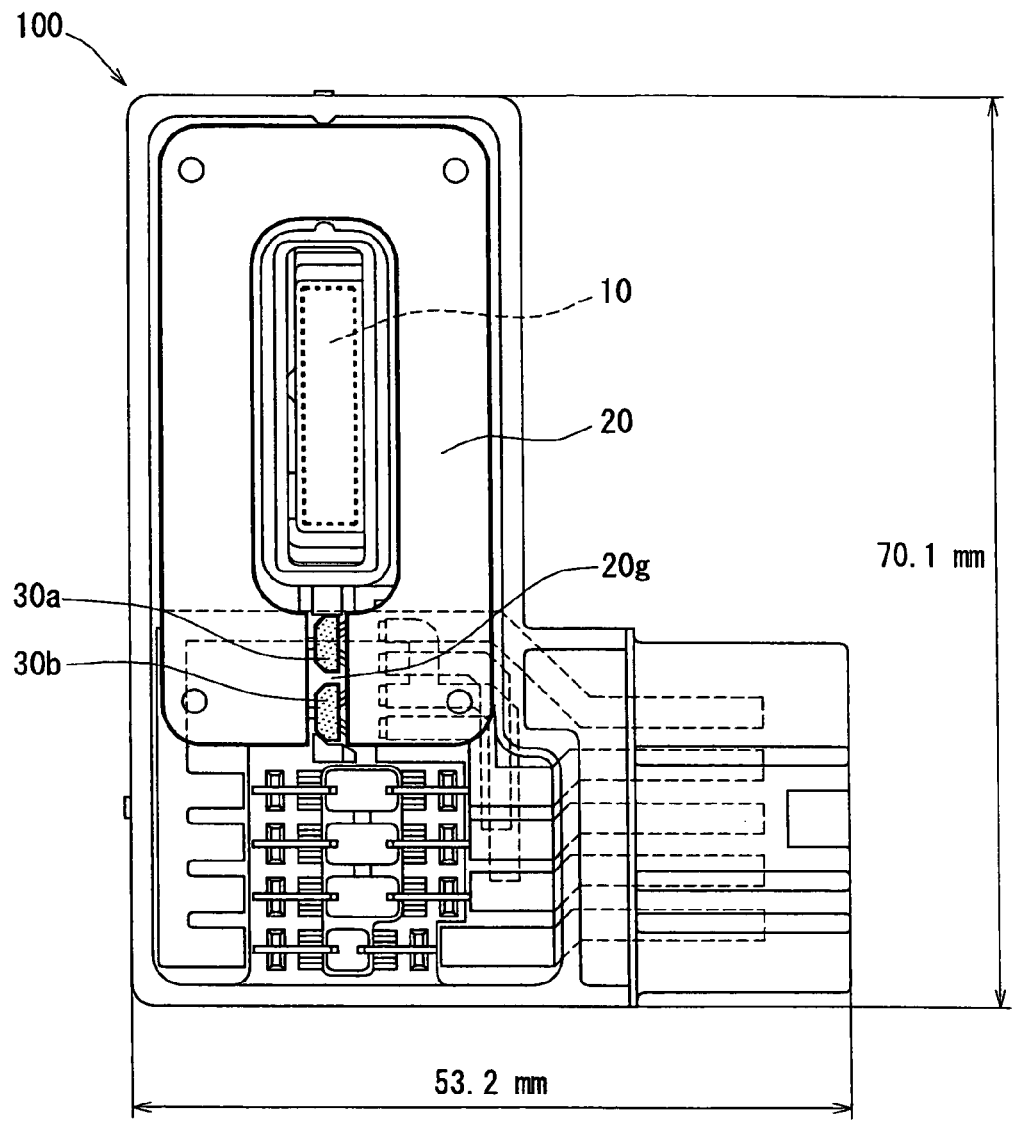
FIG. 1A is a schematic transparent top view showing a current detection apparatus according to an embodiment of the present invention.
Figure 1B:
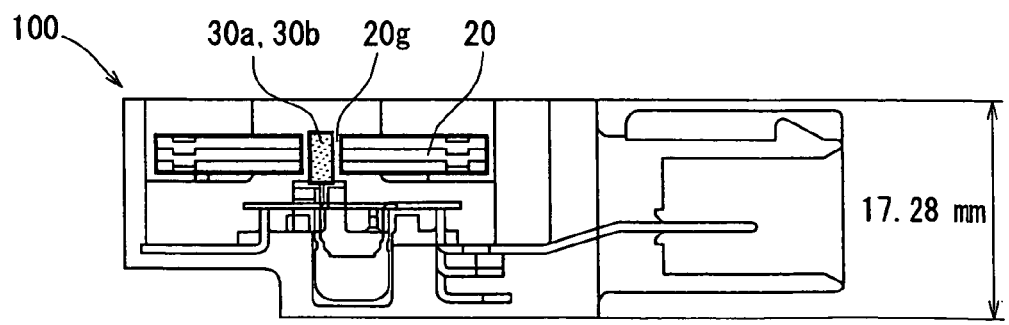
FIG. 1B is a side view of FIG. 1A.

Whereas multiple current detection apparatus 90 are essential to meet the opposite requirements, the current detection apparatus 100 alone can meet the opposite requirements. By using the current detection apparatus 100, therefore, it is possible to reduce manufacturing cost and process. Further, overall size can be reduced and an installation space for the current detection apparatus 100 can be easily provided. For example, as shown in FIGS. 1A and 1B, the current detection apparatus 100 has a width of 53.2 mm, a length of 70.1 mm, and a depth of 17.28 mm.

External magnetic field such as the earth's magnetic field tends to enter the gap 20g from the outer periphery of the magnetic core 20. Because the accurate measurement range of the magnetic sensor 30a is smaller than the wide measurement range of the magnetic sensor 30b, the magnetic sensor 30a is arranged on the inside of the magnetic sensor 30b. Specifically, the magnetic sensor 30a is arranged at a center of magnetic core 20, and the magnetic sensor 30b is arranged at an outer side of the magnetic core 20.

The magnetic core 20 has a higher density of the magnetic flux generated by the current I at the center side than at the outer side. Further, the magnetic sensor 30a may need to measure the current I at higher resolution than the magnetic sensor 30b, because the accurate measurement range of the magnetic sensor 30a is smaller than the wide measurement range of the magnetic sensor 30b. As described above, the magnetic sensor 30a is arranged on the inside of the magnetic sensor 30b. In the current detection apparatus 100, therefore, the magnetic sensors 30a, 30b can measure the current I at resolutions suitable for the respective measurement ranges.

Alternatively, in the embodiment, three or more magnetic sensors may be arranged in the gap 20g.

Figure 4A:
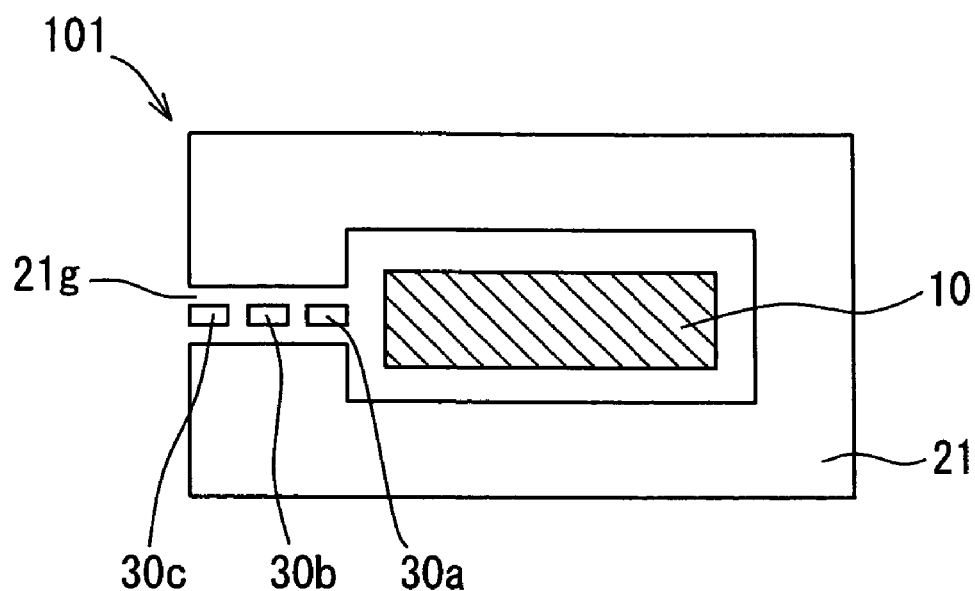
FIG. 4A is a view showing a portion of a current detection apparatus according to another embodiment of the present invention.

Referring to FIG. 4A, a current detection apparatus 101 includes a ring-shaped magnetic core 21 having a gap 21g and three magnetic sensors 30a, 30b, and 30c arranged in the gap 21g. The magnetic sensors 30a, 30b, and 30c have different current measurement ranges.

Figure 4B:
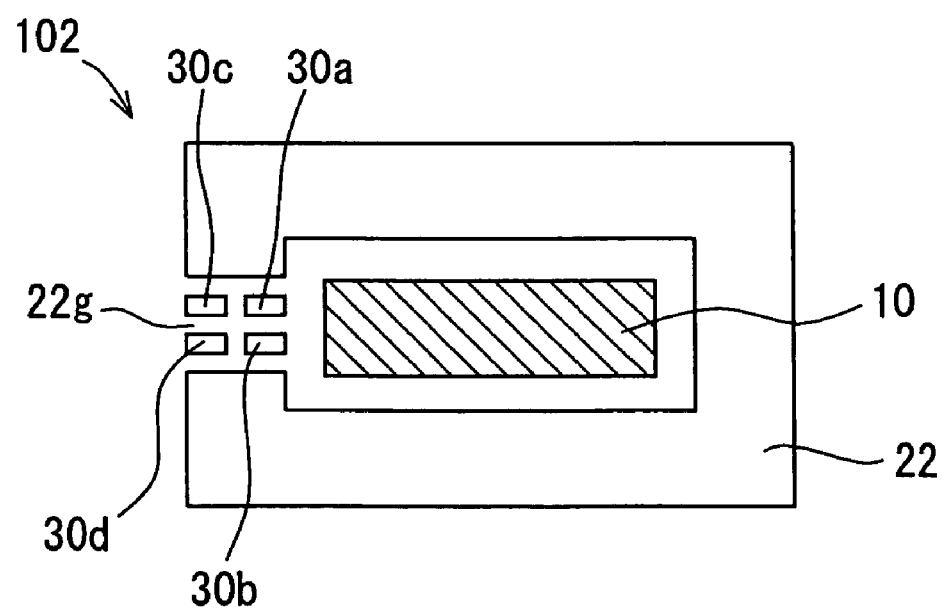
FIG. 4B is a view showing a portion of a current detection apparatus according to another embodiment of the present invention.

Referring to FIG. 4B, a current detection apparatus 102 includes a ring-shaped magnetic core 22 having a gap 22g and four magnetic sensors 30a, 30b, 30c, and 30d arranged in the gap 21g. The magnetic sensors 30a, 30b, 30c, and 30d have different current measurement ranges.

Figure 5A:
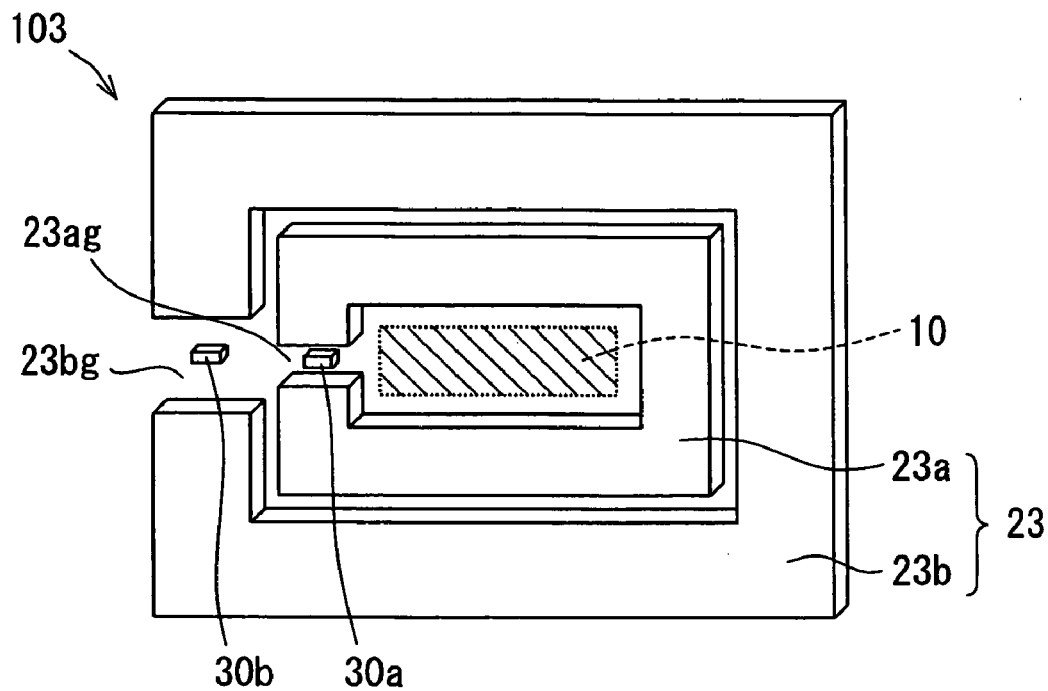
FIG. 5A is a perspective view showing a portion of a current detection apparatus according to another embodiment of the present invention.

Referring to FIG. 5A, a current detection apparatus 103 includes a ring-shaped magnetic core 23 divided concentrically into a first ring-shaped core portion 23a having a gap 23ag and a second ring-shaped core portion having a gap 23bg, a magnetic sensor 30a arranged in the gap 23ag, and a magnetic sensor 30b arranged in the gap 23bg. In the current detection apparatus 103, widths of the first and second core portions 23a, 23b as the magnetic flux path and distances of gaps 23ag, 23bg can be adjusted in accordance with desired current measurement ranges of the magnetic sensors 30a, 30b, respectively, without increasing overall size.

Figure 5B:
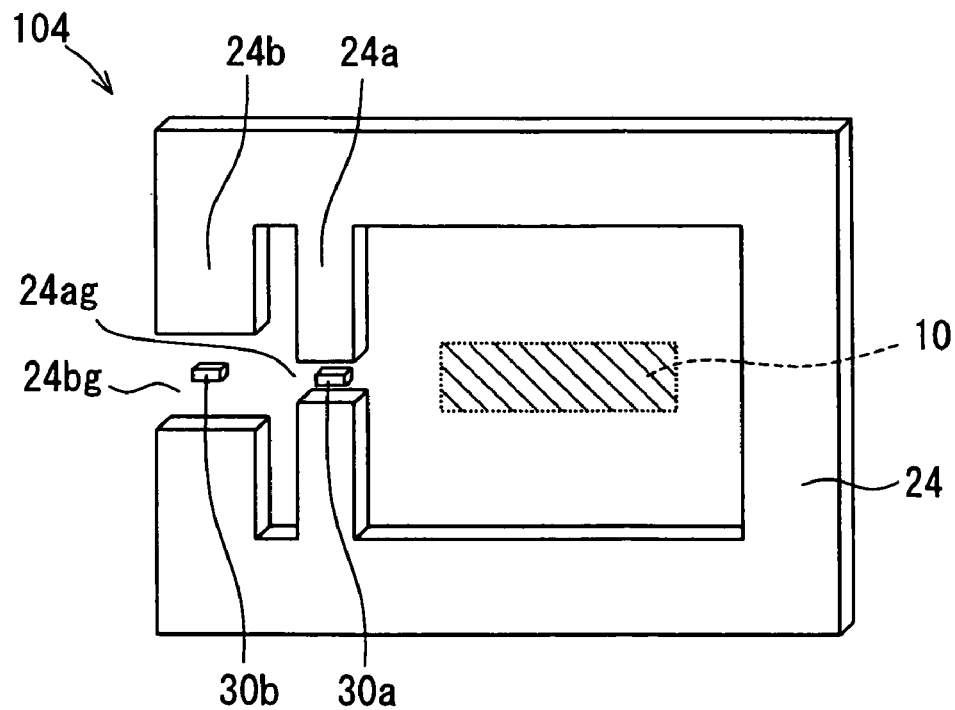
FIG. 5B is a perspective view showing a portion of a current detection apparatus according to another embodiment of the present invention.

Referring to FIG. 5B, a current detection apparatus 104 includes a ring-shaped magnetic core 24 having gaps 24ag, 24bg and magnetic sensors 30a, 30b arrange in the gaps 24ag, 24bg, respectively. The magnetic core 24 is branched along the magnetic flux path at end portions into a first branch portion 24a for providing the gap 24ag and a second branch portion for providing the gap 24bg. In the current detection apparatus 104, widths of the first and the end portions 24a, 24b as the magnetic flux path and distances of gaps 24ag, 24bg can be adjusted in accordance with desired current measurement ranges of the magnetic sensors 30a, 30b, respectively, without increasing overall size.

Similarly to the magnetic sensor 30 of FIGS. 8A to 8C, each of the magnetic sensors 30a-30d is constructed as the Hall effect IC such that the Hall effect element 30h and the peripheral circuit are packaged in a single IC.

Referring to FIGS. 6A to 6D, a current detection apparatus 105 includes a ring-shaped magnetic core 25 having a gap 25g, and a magnetic sensor 31. The magnetic sensor 31 measures the current I in two different measurement ranges and outputs two signals corresponding to the measured current.

Figure 6A:
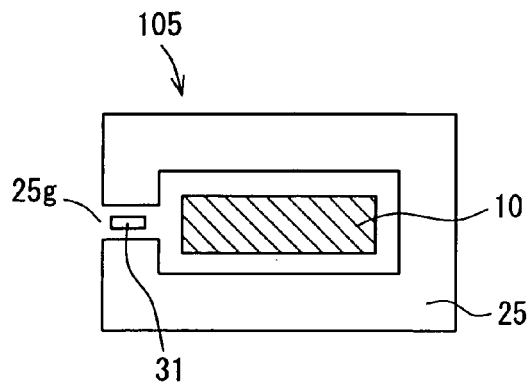
FIG. 6A is a view showing a portion of a current detection apparatus according to another embodiment of the present invention.
Figure 6B:
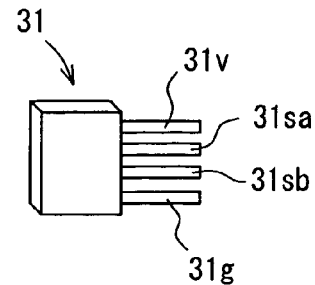
FIG. 6B is a view showing a magnetic sensor of FIG. 6A, and FIGS. 6C and 6D are circuit diagrams of the magnetic sensor of FIG. 6B.
Figure 6C:
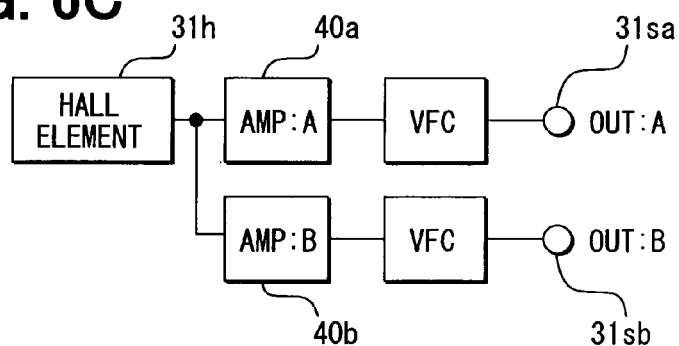
Figure 6D:
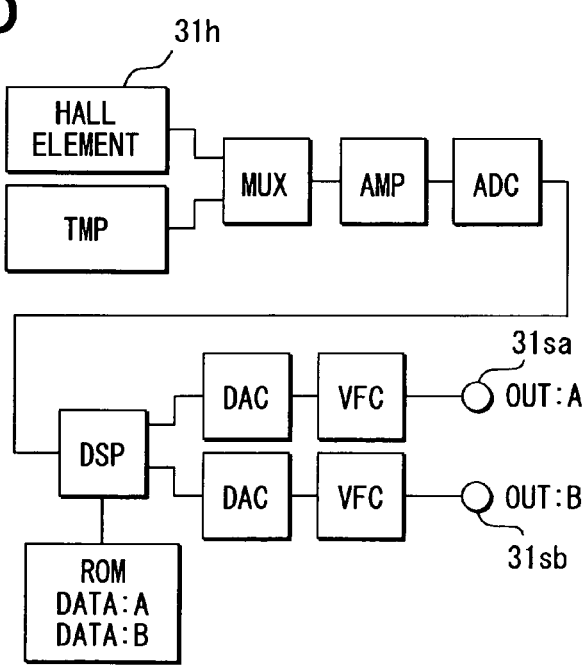
Figure 7:
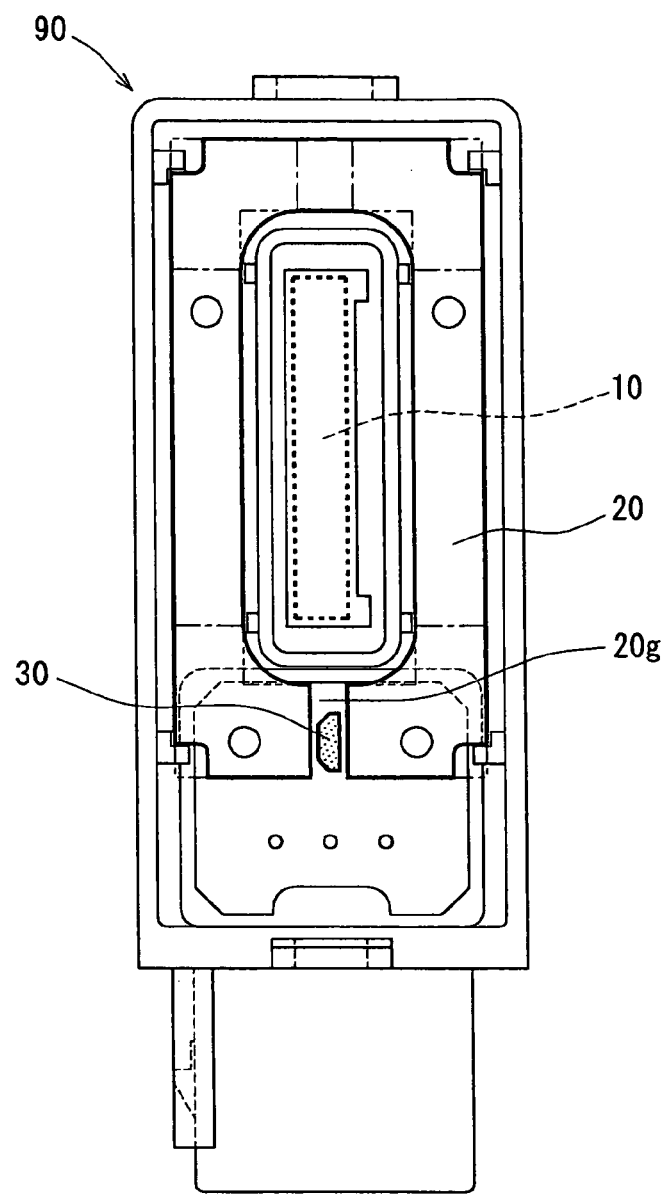
FIG. 7 is a schematic transparent top view showing a current detection apparatus according to prior art.

As shown in FIG. 6B, the magnetic sensor 31 has a power terminal 31v, ground terminal 31g, and output terminals 31sa, 31sb. For example, as shown in FIG. 6C, the magnetic sensor 31 is a Hall effect IC such that a Hall effect element 31h and amplifiers 40a, 40b are packaged in a single IC. The amplifier 40a has a gain A and the amplifier 40b has a gain B different from the gain A so that the Hall effect IC of FIG. 6C can output the two different signals (i.e., OUT:A, OUT:B) corresponding to the measured current I, through the output terminals 31sa, 31sb, respectively. Alternatively, as shown in FIG. 6D, the magnetic sensor 31 may be a Hall effect IC such that the Hall effect element 31h and a read only memory (ROM) that stores the two different measurement range data A, B. In the Hall effect IC of FIG. 6D, gain of the AMP may be changed or multiplication may be applied to one of digital signal in the DPS to change. In such approaches, the Hall effect IC of FIG. 6D has two different gains to output the two different signals (i.e., OUT:A, OUT:B) corresponding to the measured current I, through the output terminals 31sa, 31sb, respectively. Alternatively, the magnetic sensor 31 may be a Hall effect IC such that two circuits of FIGS. 8B and 8C are disposed on one semiconductor substrate and packaged in a single IC.

Thus, in the current detection apparatus 105, the magnetic sensor 31 measures the current I in the two different measurement ranges and outputs two signals corresponding to the measured current.

As described above, in the current detection apparatus according to the present invention, the current I is measured in multiple different measurement ranges and multiple different signals corresponding to the measured current I can be provided. The signals can be used for various control purposes related to the measured current I. The current detection apparatus alone covers multiple measurement ranges so that manufacturing cost and process can be reduced. The overall size can be reduced, and accordingly the installation space can be easily provided. Therefore, the current detection apparatus is suitable for measuring the charging and discharging current of the vehicular battery.

(Modifications)

Figure 9:
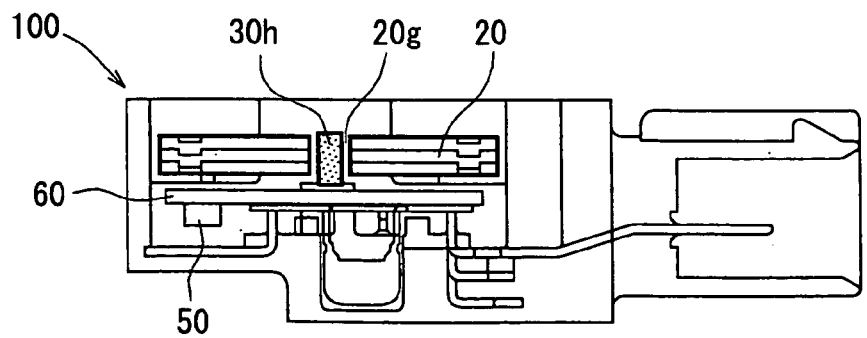
FIG. 9 is a view showing a modification of the embodiment of FIG. 1B.

The embodiments described above may be modified in various ways. For example, the Hall effect element 30h alone may be arranged in the gap. In this case, the peripheral circuit may be arranged in a different portion of the current detection apparatus. For example, as shown in FIG. 9, the peripheral circuit may be packaged in an IC chip 50, and the Hall effect element 30h and the IC chip 50 may be connected through a printed circuit board 60.

Other magnetic sensing elements such as a magnetoresistive element (MRE) may be used instead of the Hall effect element 30h. In each case, each of the magnet sensors arranged in the gap have the different measurement range.

Such changes and modifications are to be understood as being within the scope of the present invention as defined by the appended claims.

What is claimed is:

1. A current detection apparatus for measuring current flowing through a current path, comprising:
   a magnetic core having a ring shape with a gap and a center opening portion through which the current path is disposed; and
   a magnetic sensor having a magnetic sensing element arranged in the gap, wherein
   when the current flows through the current path, the magnetic core generates magnetic flux therein so that a magnetic field is generated in the gap,
   the magnetic sensor includes a plurality of amplifiers, each of which has a different gain and outputs an electrical signal corresponding to an intensity of the magnetic field in the gap,
   the current detection apparatus further comprises a plurality of magnetic sensor output terminals each of which outputs the electrical signal from a different one of the amplifiers, and
   the current detection apparatus measures the current based on at least one of the electrical signals outputted from the magnetic sensor.

2. The current detection apparatus according to claim 1, wherein the magnetic sensor comprises a plurality of magnetic sensing elements arranged in the gap, each of which has a different gain.

3. The current detection apparatus according to claim 1, wherein
   the magnetic sensor is an integrated circuit having the magnetic sensing element,
   the integrated circuit is one of a plurality of integrated circuits, and
   each of the integrated circuits is arranged in the gap and has the different gain.

4. The current detection apparatus according to claim 3, wherein one of the integrated circuits has a measurement range, which is smaller than that of another integrated circuit, in a case where the one integrated circuit is disposed on an inside of the other integrated circuit.

5. The current detection apparatus according to claim 3, wherein
   the magnetic core includes a plurality of core portions in such a manner that the core portions are arranged concentrically,
   each of the core portions has a gap in the ring shape thereof, and
   each of the integrated circuits is arranged in the respective gap.

6. The current detection apparatus according to claim 3, wherein
   the gap in the ring shape provides a pair of end portions in the ring shape,
   the pair of end portions of the magnetic core is branched into a plurality of pairs of branch portions,
   each pair of the branch portions provides a gap therebetween, and
   each of the integrated circuits is arranged in the respective gap.

7. The current detection apparatus according to claim 1, wherein the amplifiers of the magnetic sensor connect to the magnetic sensing element.

8. The current detection apparatus according to claim 7, wherein
   the magnetic sensor is an integrated circuit into which the magnetic sensing element and the amplifiers are integrated.

9. The current detection apparatus according to claim 1, wherein
   the magnetic sensor further includes a plurality of memory devices that are connected to the magnetic sensing element and store a plurality of data, each data corresponding to the different gain.

10. The current detection apparatus according to claim 9, wherein
    the magnetic sensor is an integrated circuit into which the magnetic sensing element and the memory device are integrated.

11. The current detection apparatus according to claim 1, wherein the current to be measured charges and discharges a battery of a vehicle.

12. The current detection apparatus according to claim 11, wherein
    the magnetic sensor has two different measurement ranges to output two different electrical signals corresponding to the intensity of the magnetic field in the gap,
    one measurement range corresponds to a wide measurement range in which discharging current of a battery of a vehicle is detectable when an engine of the vehicle starts, and
    the other measurement range corresponds to an accurate measurement range in which charging and discharging current of the battery of the vehicle is detectable when the vehicle runs.

13. The current detection apparatus according to claim 3, wherein
    the gap has a plurality of gap portions,
    each of the gap portions has a different gap distance therein, and
    each of the integrated circuits is arranged in the respective gap portion.

14. The current detection apparatus according to claim 12, wherein
    the wide measurement range is approximately from 0 ampere to minus 1000 amperes, and
    the accurate measurement range is approximately from minus 100 amperes to plus 100 amperes.

15. The current detection apparatus according to claim 1, wherein the magnetic sensing element is a Hall effect element.

16. The current detection apparatus according to claim 1, wherein the amplifiers are not connected in a cascade arrangement.

17. A current detection apparatus for measuring current flowing through a current path, comprising:
    a magnetic core having a ring shape with a gap and a center opening portion through which the current path is disposed; and
    a magnetic sensor having a magnetic sensing element arranged in the gap,
    wherein when the current flows through the current path, the magnetic core generates magnetic flux therein so that magnetic field is generated it the gap,
    wherein the magnetic sensor includes a plurality of amplifiers, each of which has a different gain and corresponds to an intensity of the magnetic field in the gap,
    wherein the current detection apparatus measures the current based on an electrical signal outputted from the magnetic sensor, and
    wherein the current to be measured charges and discharges a battery of a vehicle.

18. The current detection apparatus according to claim 17, wherein the magnetic sensor has two different measurement ranges to output two different electrical signals corresponding to the intensity of the magnetic field in the gap, wherein one measurement range corresponds to a wide measurement range in which discharging current of a battery of a vehicle is detectable when an engine of the vehicle starts, and wherein the other measurement range corresponds to an accurate measurement range in which charging and discharging current of the battery of the vehicle is detectable when the vehicle runs.

19. The current detection apparatus according to claim 18, wherein the wide measurement range is approximately from 0 ampere to minus 1000 amperes, and wherein the accurate measurement range is approximately from minus 100 amperes to plus 100 amperes.

* * * * *